United States Patent [19]

Shigenari et al.

[11] Patent Number: 5,266,852
[45] Date of Patent: Nov. 30, 1993

[54] FILTER CIRCUIT FOR INTEGRATED CIRCUIT

[75] Inventors: Toshihiko Shigenari; Toshihide Miyake, both of Nara, Japan

[73] Assignee: Sharp Kabushiki Kaisha, Osaka, Japan

[21] Appl. No.: 836,920

[22] Filed: Feb. 19, 1992

[30] Foreign Application Priority Data

Feb. 28, 1991 [JP] Japan .................................. 3-34504

[51] Int. Cl.[5] ............................................. H03B 1/04
[52] U.S. Cl. ................................... 307/520; 307/556; 328/167; 330/252; 330/257
[58] Field of Search ............... 307/520, 556; 328/167; 330/252, 257, 260

[56] References Cited

U.S. PATENT DOCUMENTS 4,558,287 12/1985 Tanaka ................................ 330/252
4,804,904 2/1989 Katakura ............................ 330/252
4,812,773 3/1989 Yamamoto et al. ............... 307/520

FOREIGN PATENT DOCUMENTS 1-236406 5/1989 Japan .

Primary Examiner—William L. Sikes
Assistant Examiner—Scott A. Ouellette
Attorney, Agent, or Firm—Nixon & Vanderhye

[57] ABSTRACT

Transistors Q11 and Q12 constitute a first differential amplifier, their emitters are connected with each other by a resistor R1 and also connected respectively to constant-current sources CS11 and CS12. Transistors Q15 to Q17 constitute a second differential amplifier, and the collector of the transistor Q16 is connected with a current mirror 17. This current mirror circuit 17 is constituted by transistors Q18 and Q19 and resistors R3 and R4. The capacitor 22 is supplied with a current from the current mirror circuit 17, and its voltage is fed back through a buffer circuit 14 to the base of the transistor Q12 as a component of the first differential amplifier.

4 Claims, 4 Drawing Sheets

FILTER CIRCUIT FOR INTEGRATED CIRCUIT

BACKGROUND OF THE INVENTION

1. Field of the Invention

The present invention relates to a filter circuit for an integrated circuit, and more particularly to an active filter for operation at a low supply voltage.

2. Description of the Related Art

A filter circuit is intended for removing unnecessary components and accepting necessary components from various frequency components of a signal. There are a large variety of filter circuits. Roughly classified, the filter circuits can be divided into passive filters, active filters, and digital filters.

An active filter comprises passive devices, such as a capacitor (C) and a resistor (R), and active devices, such as a transistor and an operational amplifier. Particularly, in the voice frequency band, CR feedback type filters including C and R and active devices are used very widely. Meanwhile, in this frequency band, the time constant of a CR coupling circuit is long, the capacitor is required to have a large capacity, and above all, the resistor is required to have high accuracy. Therefore, when a filter circuit is formed as a semiconductor integrated circuit, it is difficult to mount the C and R in the same single semiconductor substrate.

This inventor knows an integrated circuit applicable to solve the above problem, in which integrated circuit an active filter is configured by using a voltage-input current-output type amplifier, namely a transconductance amplifier, with the aim of reducing the required number of component parts.

As an example of such a circuit, FIG. 1 shows a primary low-pass filter. In FIG. 1, a transconductance amplifier 40 comprises transistors Q41 to Q49, resistors RE and RE, and constant-current circuits CS41 to CS43. Reference numerals 41 and 43 denote an input terminal and an output terminal of the low-pass filter. A capacitor 42 is connected between an output line 45 of the transconductance amplifier 40 and a ground (GND) line 46, and the output line 45 is connected to an input terminal of a buffer circuit 44 with an amplification factor of 1.0. Output of the buffer circuit 44 is connected to the output terminal 43 and the base of a transistor Q42, which is a component part of the transconductance amplifier 40. The transistors Q47 to Q49 of the transconductance amplifier 40 constitute a Wilson current mirror circuit, the mirror factor of which is a value close to 1.

The minimum operating voltage $VCC_{MIN}$ of an active filter of this kind is determined by a voltage across a constant-current source CS42, the collector-emitter voltage of the transistor Q46, the base-emitter voltage of the transistor Q49, and the base-emitter voltage of the transistor Q48. Therefore, when the constant-current source CS42 is formed by one transistor and the collector-emitter voltage $V_{CE}$ of the transistor is 0.4 V with the base-emitter voltage $V_{BE}$ at 0.6 V, the minimum operating voltage $VCC_{MIN}$ is given as shown below.

$VCC_{MIN} = V_{CE}(CS42) + V_{CE}(Q46) + V_{BE}(Q49) + V_{BE}(Q48) = 0.4 + 0.4 + 0.6 + 0.6 = 2.0$ V

Meanwhile, when a filter such as this is mounted in a battery-driven integrated circuit, the circuit should preferably configured so as to operate at a supply voltage of about 1.8 V. For this reason, a filter circuit as shown in FIG. 1 not suitable for this application.

In a differential amplifier formed by the transistors Q41 and Q42, a voltage drop occurs at the resistors RE and RE connected to the emitters of those transistors, so that the minimum operating voltage is decreased by the value of the voltage drop. Also in this respect, the filter circuit shown in FIG. 1 is not suited for operation at a low supply voltage.

SUMMARY OF THE INVENTION

It is therefore an object of the present invention to provide a filter circuit for use in an integrated circuit, which filter circuit is able to operate on a supply voltage of 1.8 V and uses a transconductance amplifier in a simple configuration. According to the present invention, the above object can be achieved by a filter circuit for an integrated circuit comprising a first differential amplifier including first and second transistors having the emitters connected with each other by a resistor and also connected respectively to first and second constant-current sources and having the connectors connected to the power supply line through transistors wired to operate as diodes; a second differential amplifier including a third transistor having the emitter connected to a third constant-current source, the collector connected to the power supply line through a transistor used as a diode and a resistor and the base connected to the collector of the first transistor, and a fourth transistor having the emitter connected to the third constant-current source and the base connected to the collector of the second transistor; a voltage-input current-output amplifier comprising a current mirror circuit including a fifth transistor having the collector and the base connected to the collector of the fourth transistor and the emitter connected through a resistor to the power supply line and a sixth transistor having the collector connected to a fourth power supply line, the base connected to the base of the fifth transistor and the emitter connected through a resistor to the power supply line, said voltage-input current-output type amplifier using the base of the first transistor as an input terminal, the base of the second transistor as a feedback input terminal, and the collector of the sixth transistor as an output terminal; and a buffer circuit having the input terminal connected to the output terminal and the output terminal connected to the feedback input terminal.

When the amplitude of a signal supplied to the input terminal is denoted by $V_{OP}$ and the amplitude of the output current is denoted by $i_o$, the conductance gm of the voltage-input current-output type amplifier is $gm = V_{OP}/i_o$. When the current value of the first and second constant-current sources is denoted by $I_1$ and the value of the first resistor is denoted by $R_1$, the conductance gm can be expressed by the following equation.

$gm = (1/R_1)(I_2/I_1)$

If the transfer function $T_1(s)$ of the filter circuit cording to the present invention is expressed by denoting the value of the capacitor by C and using the conductance gm, we have:

$T_1(s) = (gm/C)/\{s + (gm/C)\}$

From this equation, it is understood that the filter circuit according to the present invention has a frequency characteristic of a primary low-pass filter, having the cutoff frequency of gm/2π C.

If the third constant-current source is formed by a transistor, the minimum operating voltage of the filter circuit according to the present invention will be the sum of the collector-emitter voltage of the transistor of the third constant-current source, the collector-emitter voltage of the fourth transistor, the base-emitter voltage of the sixth transistor, and the voltage drop at the second resistor. Therefore, if the collector-emitter voltage and the base-emitter voltage of the transistors are 0.4 V and 0.6 V and the voltage drop at the second resistor is $V_R$, the minimum operating voltage is 0.4 V+0.4 V+0.6 V+$V_R$. To be more specific, the filter circuit according to the present invention operates sufficiently on the supply voltage of 1.8 V, and is particularly suitable for use in battery-driven electronic devices.

In other words, in this invention, in place of the conventional Wilson current mirror circuit, a current mirror circuit formed by two transistors is used for the current mirror circuit at the output section of the transconductance amplifier, so that the minimum operating current of the filter circuit is decreased to thereby enable the filter circuit to operate on the supply voltage of 1.8V.

The first differential amplifier is arranged such that the emitters of the first and second transistors are connected to each other by a resistor. Therefore, the conventional problem of voltage drop at those emitter-connected resistors is precluded, in which respect, too, this filter circuit is suitable for operation at low voltage, and the circuit configuration is simple at that.

Further objects and advantages of the present invention will be apparent from the following description of the preferred embodiments of the invention as illustrated in the accompanying drawings.

DESCRIPTION OF THE PREFERRED EMBODIMENTS

Figure 1:
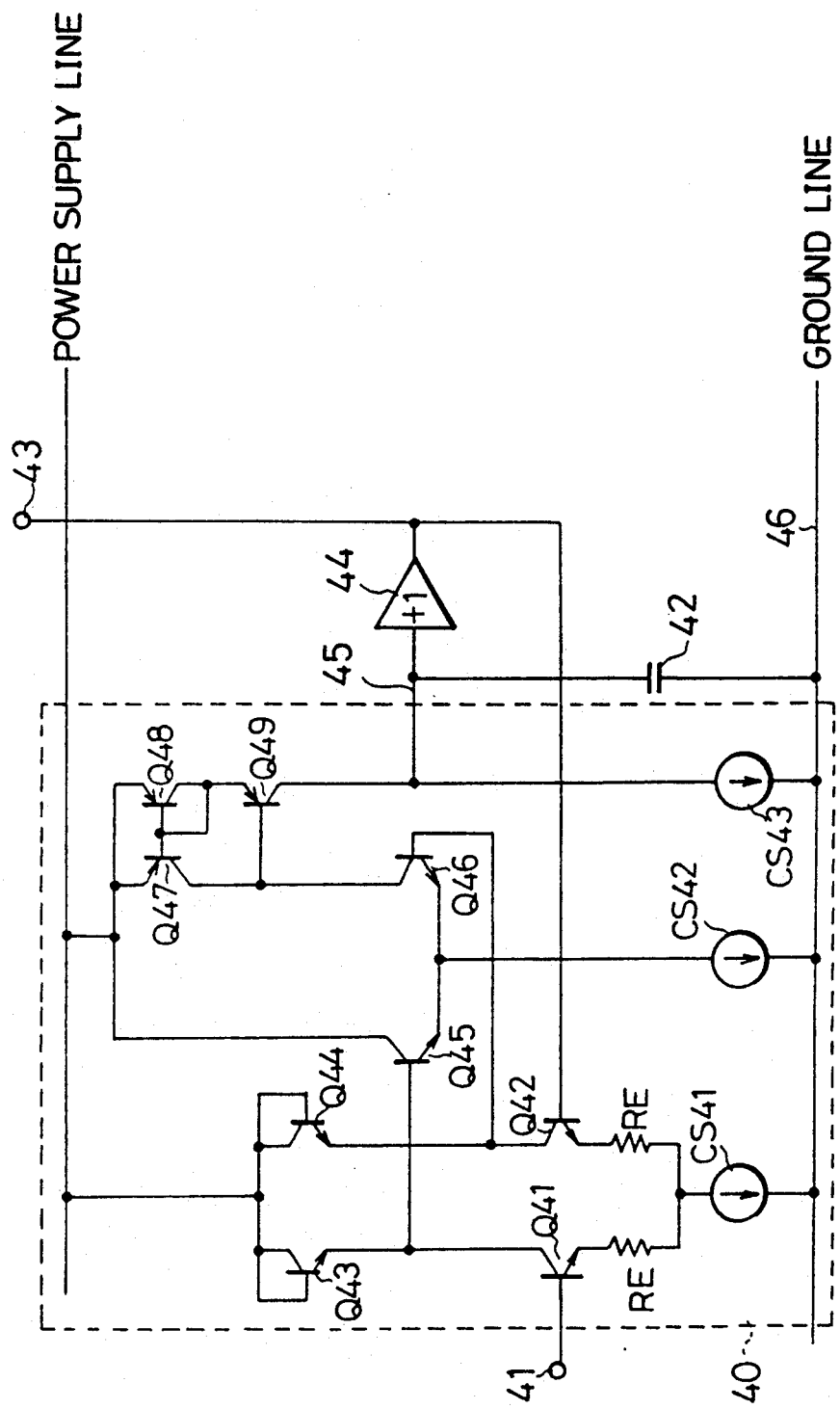
FIG. 1 is a circuit diagram showing a conventional filter circuit for an integrated circuit, which has been described.
Figure 2:
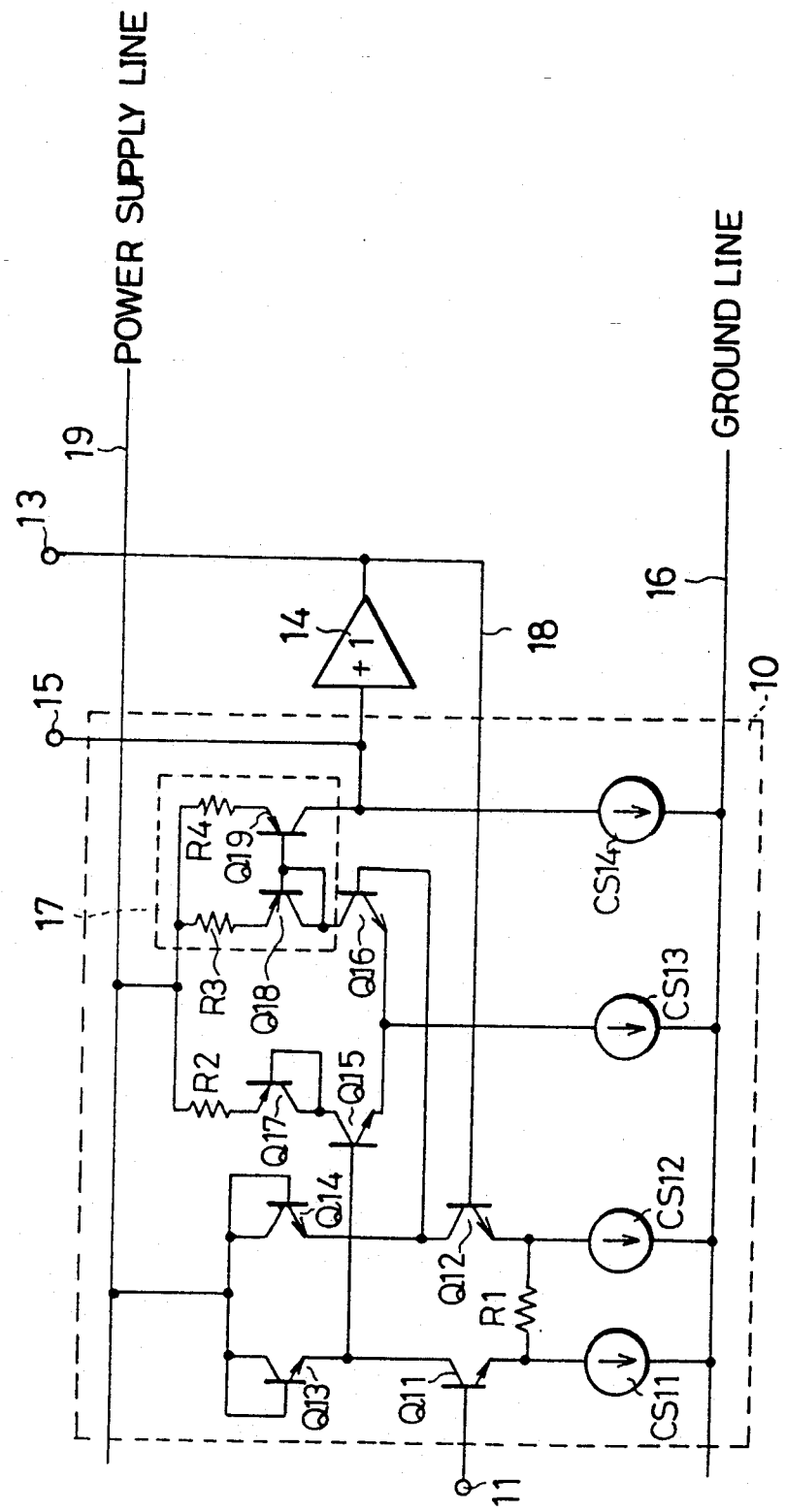
FIG. 2 is a circuit diagram showing a preferred embodiment of the filter circuit for an integrated circuit.

FIG. 2 shows a filter circuit for an integrated circuit as a preferred embodiment of the present invention. This filter circuit chiefly comprises a transconductance amplifier 10 and a buffer circuit 14 with an amplification factor of 1.

The transconductance amplifier 10 includes a first differential amplifier, a second differential amplifier and a current mirror 17.

The first differential amplifier includes transistors Q11 and Q12 having the emitters connected to the other ends of constant-current sources CS11 and CS12 which are connected at one end to ground (GND) line, and, on the other hand, has the collectors connected to the power supply line 19 through transistors Q13 and Q14 wired to use as diodes. The emitters of the transistors Q11 and Q12 are connected to each other by a resistor R1.

The second differential amplifier includes a transistor Q15 having the emitter connected to the other end of a constant-current source CS13 which is connected at one end to the ground line 16, the collector connected to the power supply line 19 through a transistor Q17 used as a diode and a resistor R2, and the base connected to the collector of the transistor Q11, and also includes a transistor Q16 having the emitter connected to the emitter of the transistor Q15 and the base connected to the collector of the transistor Q12.

The mirror circuit 17 includes a base-collector-coupled transistor Q18 used as a diode, which transistor having the collector connected to the collector of the transistor Q16 and the emitter connected to the power supply line 19 through a resistor R3, and a transistor Q19 having the collector connected to the other end of a constant-current source CS14 which is connected at one end to the ground line 16, the base connected to the base of the transistor Q18, and the emitter connected to the power supply line through a resistor R4.

The transconductance amplifier 10 having the input terminal 11 connected to the base of the transistor Q11, the output terminal 15 connected to the collector of the transistor Q19, and the feedback input line 18 connected to the base of the transistor Q12.

The buffer circuit 14 has the input terminal connected to the output terminal 15 of the amplifier 10, and the output terminal connected to the output terminal 13 of the filter circuit and also to the feedback input line 18 of the amplifier 10.

Figure 3:
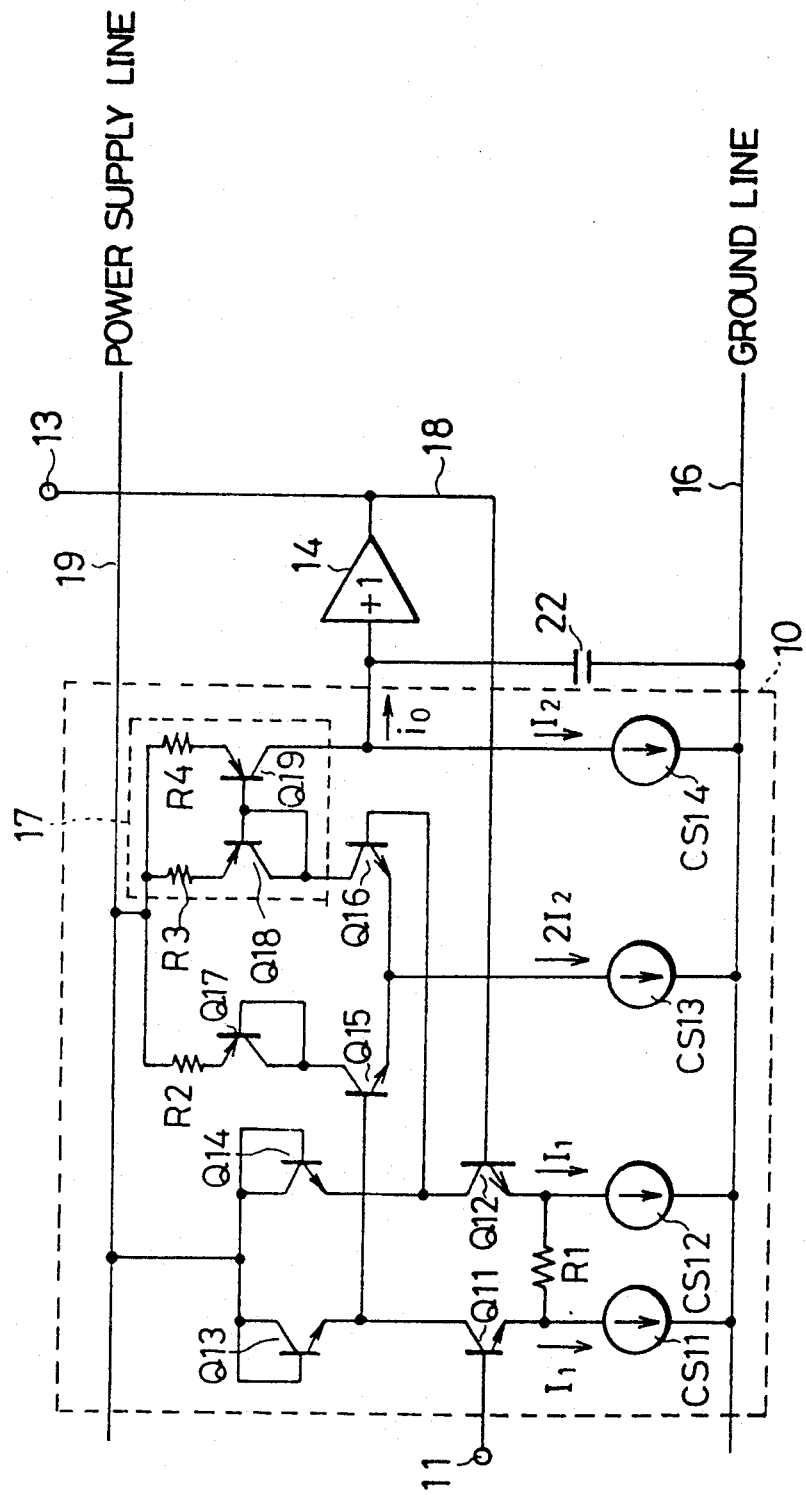
FIG. 3 is a circuit diagram showing a concrete example of the filter circuit for an integrated circuit in FIG. 1.

FIG. 3 is a more concrete example of the circuit configuration in FIG. 2. In the circuit of FIG. 3, a capacitor 22 formed by an oxide film capacity in the semiconductor substrate is connected between the output terminal of the transconductance amplifier 10 and the ground line 16. The construction of the parts other than those shown in FIG. 3 is the same as is shown in FIG. 2.

The transfer function of the primary low-pass filter constructed as described is derived in the following. Let the current value of the constant-current sources CS11 and CS12 be denoted by $I_1$, the current value of the current source CS13 by 2 $I_2$, the current value of the current source CS14 by $I_2$, the capacity of the capacitor 22 by C, and let the current amplification factor be infinity. If a signal with an amplitude of $V_{OP}$ is input to the input terminal 11 and the amplitude of the output current at this time is denoted by $i_o$, $$V_{BE11} - V_{BE12} = (kT/q) \ln \{(I_1+i)/(I_1-i)\} = \Delta V_A$$

$$V_{BE16} - V_{BE15} = (kT/q) \ln \{(I_2+i)/(I_2-i_o)\} = \Delta V_B$$

where $V_{BE11}$, $V_{BE12}$, $V_{BE16}$, and $V_{BE15}$ are the base-emitter voltages of the transistors Q11, Q12, Q16, and Q15, k is a Boltzmann constant, T is the absolute temperature, q is the electron charge, i is a variation of the collector current by the input signal of the differential amplifier having the transistors Q11 and Q12, and $i_o$ is the output current of the transconductance amplifier 10.

Since $\Delta V_A = \Delta V_B$, $$(I_1+i)/(I_1-i) = (I_2+i_o)/(I_2-i_o)$$

$$i_o = (I_2/I_1) \cdot i = (I_2/I_1) \cdot (V_{OP}/R_1)$$

Thus, the conductance gm of the transconductance amplifier 10 is:

$$gm = i_o/V_{OP} = (1/R_1)\cdot(I_2/I_1) \qquad (1)$$

$R_1$ represents the resistance value of the resistor $R_1$. To obtain the transfer function $T_1(s)$ of the filter circuit, let the input signal be $V_{in}$ and the output signal be $V_{OUT}$, and $$V_{OUT} = i_o/s \quad i_o = gm\,(V_{IN} - V_{OUT})$$

$$V_{OUT} = [(gm/C)/\{s+(gm/C)\}]\cdot V_{IN}$$

$$T_1(s) = (gm/C)/\{s+(gm/C)\} \qquad (2)$$

From the equation (2), it is understood that the filter circuit according to this embodiment has a frequency characteristic of a primary low-pass filter. The cutoff frequency fc is expressed from the equations (1) and (2).

$$fc = gm/2\pi C = (1/2\pi CR_1)\cdot(I_2 I_1)$$

The minimum operating voltage $VCC_{MIN}$ of this filter circuit is determined by a voltage required of the constant-current source CS13, the collector-emitter voltage of the transistor Q16, the base-emitter voltage of the transistor Q19 and the voltage $V_R$ across the resistor R3. Therefore, if the constant-current source CS13 is formed by one transistor, the collector-emitter voltage and the base-emitter voltage of the transistors are 0.4 V and 0.6 V, then the minimum operating voltage $VCC_{MIN}$ is 1.4 V+$V_R$. That is to say, this filter operates sufficiently on the supply voltage of 1.8 V with the voltage drop at the resistor R3 taken into account. In the first differential amplifier having the transistors Q11 and Q12, there is no problem of voltage drop at those emitter-connected resistors in the prior art, so that in this respect, this filter circuit is suitable for operation at low voltage.

In the meantime, in the above-mentioned derivation of the transfer function, the current amplification factor of each transistor is supposed to be infinity, but in actuality, the current amplification factor of a lateral P-N-P transistor is about 40. For this reason, the mirror factor of the mirror circuit 17 including the transistors Q18 and Q19 is not 1.0 but 0.95 when the transistor current amplification factor is 40. The effect from this appears as a linear offset of the filter circuit, resulting in a narrowed output dynamic range. To operate the filter circuit at a supply voltage as low as possible, this phenomenon should preferably be prevented.

Figure 4:
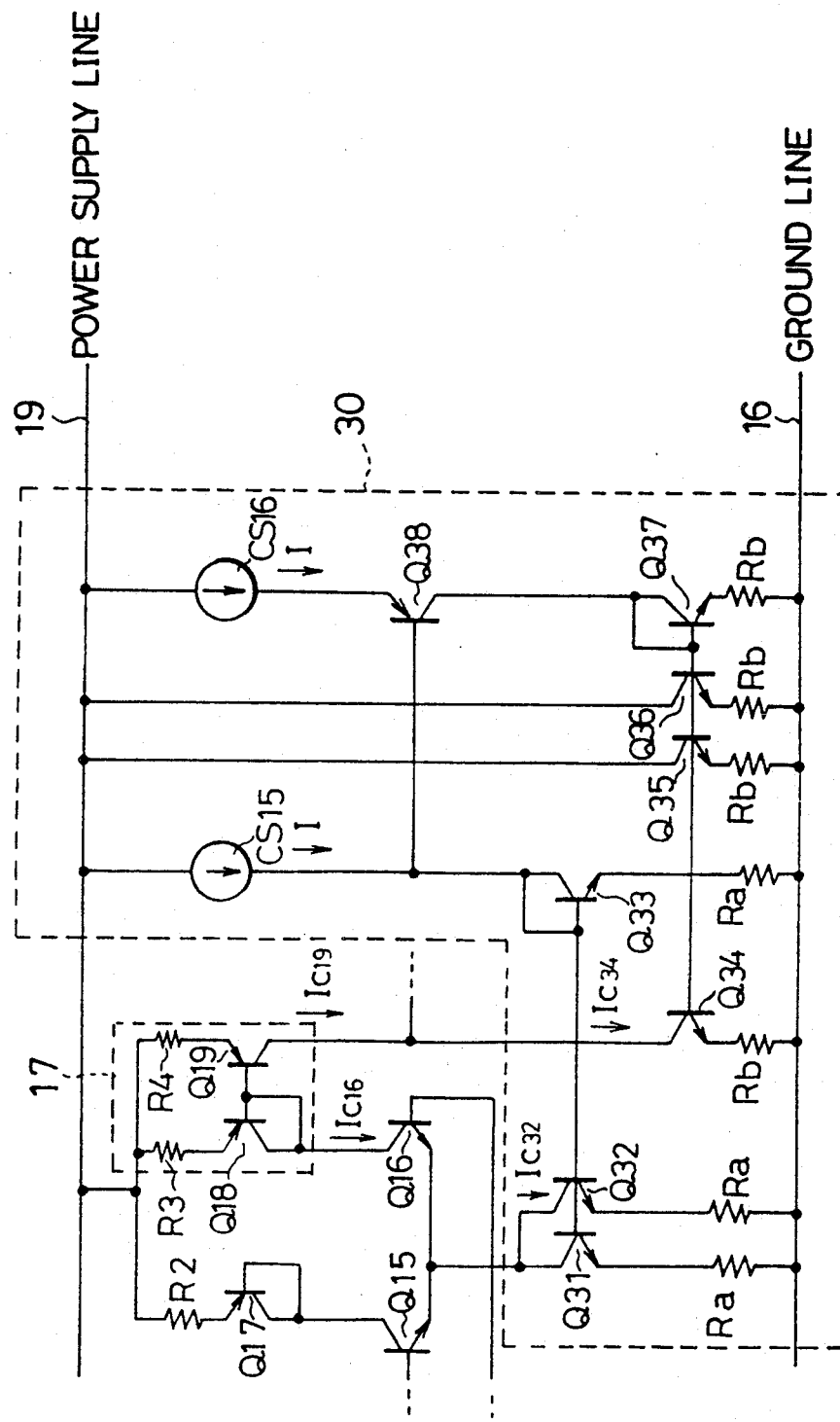
FIG. 4 is a partial circuit diagram showing an example of another arrangement of the constant-current sources of the filter circuit for use in an integrated circuit, shown in FIG. 1.

The cause of this problem is that the base current is required which is determined by the current amplification factor to conduct the collector current and as a result, the collector current of the transistor Q19 does not agree with the current value of the constant-current source CS14. Therefore, this problem can be solved by correcting the base current so make those two current values agree with each other. FIG. 4 shows a concrete example of the constant-current sources CS13 and CS14 obtained by correcting the base current.

In the circuit in FIG. 4, that section of the circuit indicated by 30 corresponds to the constant-current sources CS13 and CS14 in FIG. 3. To be more specific, transistors Q31 to Q33 and resistors Ra and Ra constitute a current mirror which corresponds to the constant-current source CS13, while transistors Q34 to Q38 and resistors Rb and Rb constitute a current mirror which corresponds to the constant-current source CS14. Transistors Q35, Q36 and Q38 are devices for correcting the base current.

The collectors of the transistors Q31 and Q32 are connected to the emitters of the transistors Q15 and Q16 constituting the second differential amplifier mentioned above. The emitters of the transistors Q31 and Q32 are connected to the ground line 16. Their bases are connected to the base of the transistor Q33. The transistor Q33 is used as a diode, and one end of the base-collector coupling circuit thereof is connected to one end of the constant-current circuit CS15 connected at the other end to the power supply line 19, while the emitter is connected to the ground line 16 through the resistor Ra.

The collector of the transistor Q34 is connected to the collector of the transistor Q19 of the mirror circuit 17, the emitter is connected to the ground line 16 through the resistor Ra, and the base is connected to the bases of the transistors Q35, Q36 and Q37.

The collectors of the transistors Q35 and Q36 are connected to the power supply line 19 and their emitters are connected to the ground line 16 through the resistors Rb and Rb. The transistor Q37 is used as a diode, the base-collector coupling circuit is connected to the collector of the transistor Q38, and the emitter is connected to the ground line 16 through the resistor Rb. The transistor Q38 is connected at the base thereof to the collector of the transistor Q33, and also connected at the emitter thereof to the other end of the constant-current source CS16 connected at one end to the power supply line 19.

Description will be made in the following to show that by use of this circuit, the collector current $I_{C19}$ of the transistor Q19 is equal to the current of the constant-current source CS14, namely, the collector current $I_{C34}$ of the transistor Q34. Let the current values of the constant-current sources CS15 and CS16 be denoted by I, the collector currents of the transistors Q16 and Q32 by $I_{C16}$ and $I_{C32}$, and the current amplification factors of the n-p-n and p-n-p transistors by $\beta_N$ and $\beta_P$.

If the base currents of the transistors Q34 to Q38 are taken into account, the collector current of the transistor Q34 is the current I of the constant-current source CS16 minus the base currents of the transistors Q38, Q34 to Q37, as shown below.

$$I_{C34} = I - I/\beta_P - 4\,I/\beta_N$$

Likewise, the collector current $I_{C32}$ of the transistor Q32 is the current I of the constant-current source CS15 plus the base current of the transistor Q38 minus the base currents of the transistors Q31 to Q33, while the collector current $I_{C16}$ of the transistor Q16 is the collector current of the transistor Q32 minus the base current of the transistor Q16. The collector current $I_{C19}$ of the transistor Q19 is the collector current of the transistor Q16 minus the base currents of the transistors Q18 and Q19. Thus, $$\begin{aligned}
I_{C32} &= I + I/\beta_P - 3I/\beta_N \\
I_{C16} &= I_{C32} - I/\beta_N \\
I_{C19} &= I_{C16} - 2I/\beta_P \\
&= I - I/\beta_P - 4I/\beta_N
\end{aligned} \qquad (4)$$

As is apparent by comparing the equations (3) and (4), the collector current $I_{C19}$ of the transistor Q19 agrees with the collector current $I_{C34}$ of the transistor Q34. Therefore, the problem of disagreement between the collector current $I_{C19}$ and the current $I_2$ of the constant-current source CS14, which results from the finiteness of the transistor current amplification factor, can be solved. Consequently, the drop of dynamic range due to the direct-current offset of the filter circuit can be prevented.

Many widely different embodiments of the present invention may be constructed without departing from the spirit and scope of the present invention. It should be understood that the present invention is not limited to the specific embodiments described in the specification, except as defined in the appended claims.

What is claimed is:

1. A filter circuit for an integrated circuit comprising:

a first differential amplifier including first and second transistors having emitters connected with each other by a resistor and also connected respectively to first and second constant-current sources and having collectors connected to a power supply line through transistors wired to operate as diodes;

a second differential amplifier including a third transistor having an emitter connected to a third constant-current source, a collector connected to the power supply line through a transistor used as a diode and a resistor and a base connected to the collector of said first transistor, and a fourth transistor having an emitter connected to said third constant-current source and a base connected to the collector of said second transistor;

a voltage-input current-output type amplifier comprising a current mirror circuit including a fifth transistor having a collector and a base connected to the collector of said fourth transistor and an emitter connected through a resistor to the power supply line and a sixth transistor having a collector connected to a fourth constant-current source, a base connected to the base of said fifth transistor and an emitter connected through a resistor to the power supply line, said voltage-input current-output type amplifier using the base of said first transistor as an input terminal, and the base of said second transistor as a feedback input terminal, and the collector of said sixth transistor as an output terminal; and a buffer circuit having an input terminal thereof connected to said output terminal and an output terminal thereof connected to said feedback input terminal.

2. A filter circuit as claimed in claim 1, wherein said circuit further comprises a capacitor connected between said output terminal of said voltage-input current-output type amplifier and the ground line.

3. A filter circuit as claimed in claim 1, wherein said circuit further comprises a circuit to correct the base current of said sixth transistor so that the current value of said fourth constant-current source agrees with the collector current value of said sixth transistor.

4. A filter circuit as claimed in claim 3, wherein said third constant-current source and said fourth constant-current source are each formed by a current mirror circuit.

* * * * *